(12) United States Patent
Sun et al.

(10) Patent No.: US 8,308,966 B2
(45) Date of Patent: Nov. 13, 2012

(54) METHOD FOR FABRICATING SEMICONDUCTOR DEVICE USING A DOUBLE PATTERNING PROCESS

(75) Inventors: Jun-Hyeub Sun, Gyeonggi-do (KR);
Shi-Young Lee, Gyeonggi-do (KR);
Jong-Sik Bang, Gyeonggi-do (KR);
Sang-Min Ju, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 671 days.

(21) Appl. No.: 12/495,196

(22) Filed: Jun. 30, 2009

(65) Prior Publication Data
US 2010/0248491 A1    Sep. 30, 2010

(30) Foreign Application Priority Data
Mar. 31, 2009    (KR) ........................ 10-2009-0027614

(51) Int. Cl.
*B44C 1/22*      (2006.01)
*H01L 21/302*    (2006.01)

(52) U.S. Cl. .............. 216/47; 216/41; 216/67; 438/706; 438/710; 438/717

(58) Field of Classification Search .................. 438/706, 438/710, 717; 216/41, 67, 47
See application file for complete search history.

(56) References Cited

U.S. PATENT DOCUMENTS

| | | | | |
|---|---|---|---|---|
| 2004/0203223 A1* | 10/2004 | Guo et al. | ..................... | 438/637 |
| 2007/0111467 A1* | 5/2007 | Kim | .............................. | 438/424 |
| 2008/0124931 A1* | 5/2008 | Lee et al. | ..................... | 438/692 |

FOREIGN PATENT DOCUMENTS

| | | |
|---|---|---|
| KR | 1020050123335 | 12/2005 |
| KR | 1020070122050 | 12/2007 |
| KR | 100819673 | 4/2008 |
| KR | 1020090016843 | 2/2009 |

OTHER PUBLICATIONS

Notice of Allowance issued from Korean Intellectual Property Office on Sep. 1, 2011.
Notice of Preliminary Rejection issued from Korean Intellectual Property Office on Jan. 20, 2011.

* cited by examiner

*Primary Examiner* — Shamim Ahmed
(74) *Attorney, Agent, or Firm* — IP & T Group LLP

(57) ABSTRACT

A method for performing a double pattering process of a semiconductor device is provided. The method includes forming a hard mask layer having a stack structure of a first layer, a second layer and a third layer in sequence, forming a first photoresist pattern over the hard mask layer, etching the third layer to form third layer patterns by using the first photoresist pattern as an etch barrier, forming a second photoresist pattern over the third layer patterns, etching the second layer to form second layer patterns by using the second photoresist pattern and the third layer patterns as an etch barrier, removing the second photoresist pattern, and etching the first layer to form first layer patterns by using the second layer patterns as an etch barrier.

24 Claims, 8 Drawing Sheets

METHOD FOR FABRICATING SEMICONDUCTOR DEVICE USING A DOUBLE PATTERNING PROCESS

CROSS-REFERENCE TO RELATED APPLICATIONS

The present application claims priority of Korean patent application number 10-2009-0027614, filed on Mar. 31, 2009, the disclosure of which is incorporated herein by reference in its entirety.

BACKGROUND OF THE INVENTION

The present invention relates to fabricating a semiconductor device, and more particularly, to a method for fabricating a semiconductor device using a multilayer hard mask layer.

A hole patterning of a micro line width is difficult to accomplish in a process for fabricating a semiconductor device having a line width of 50 nm or less due to a limitation of resolution of present exposure apparatuses. Thus, a double patterning process is used to form a hole which is easier than forming a hole by a hole patterning. The double patterning process is performed by forming lines, wherein each of the lines are crossed.

FIGS. 1A to 1D illustrate perspective views of a method for fabricating a semiconductor device using a typical double patterning process.

Referring to FIG. 1A, an amorphous carbon layer 12 is formed over an etch target layer 11, and a first layer 13 and a second layer are sequentially formed over the amorphous carbon layer 12 as a hard mask.

A first photoresist pattern 15 is formed by performing a first exposure and developing processes. A first patterning is performed to etch the second layer by using the first photoresist pattern 15 as an etch barrier. Reference numeral 14 represents an etched second layer.

Referring to FIG. 1B, after removing the first photoresist pattern 15, a second photoresist pattern 16 is formed by performing a second exposure and developing processes. The second photoresist pattern 16 has a line pattern crossing the first photoresist pattern (represent numeral 15 of FIG. 1A) at right angles.

Referring to FIG. 1C, a second patterning is performed to etch the first layer 13 by using the second photoresist pattern 16 and the etched second layer 14. In accordance with the double patterning process, a first layer pattern 13A has a plurality of openings. Herein, the openings represent patterns such as holes.

The method sequentially performing the first patterning and the second patterning is called as the double patterning process.

After removing the second photoresist pattern 16, the first layer pattern 13A has the plurality of openings, which define contact holes.

Referring to FIG. 1D, the amorphous carbon layer 12 is etched by using the first layer pattern 13A as an etch barrier. Thus, an amorphous carbon layer pattern 12A has a plurality of openings by copying the openings of the first layer pattern 13A.

Although it is not shown, the etch target layer 11 is etched by using the amorphous carbon layer pattern 12A as an etch barrier to form a plurality of patterns. The patterns of the etched etch target layer 11 include contact holes, via holes and storage node holes.

In the above described typical method, the etch process is performed by using the double hard mask having a stacked structure of the first layer 13 and the second layer 14 over the amorphous carbon layer 12.

As described above, when the double patterning process or the double hard mask are used, the limitation of resolution of present exposure apparatuses may be overcome and patterns may have a fine line width at the same time.

However, when the etching process is performed by using the double hard mask having the stacked structure of the first layer 13 and the second layer 14, processing limitations, which will be described hereafter, may occur.

Referring to FIG. 1B, when the first layer 13 is etched, a portion of the first layer 13 is etched by using the second layer 14 as the etch barrier and the rest of the first layer 13 is etched by using the second photoresist pattern 16 as the etch barrier. Therefore, since the first layer 13 is etched by using different etch barriers, critical dimensions may be undesirably changed.

Furthermore, since the first layer 13 is etched by using different etch barriers at the same etch condition, the etch processes different etch characteristics may occur depending on the different etch barriers. Specially, in case where the first layer 13 is an oxide layer, when the first layer 13 is etched by using the second photoresist layer 16 as the etch barrier, unevenness may occur after performing the etch process. Herein, the unevenness causes a winding pattern. This is because etch tolerance of the second photoresist pattern 16 is insufficient due to characteristics of the oxide layer etcher having a high ion energy. That is, when the etch process is performed using the oxide layer etcher, the second photoresist pattern 16 is transformed because of ion bombardment of the ion having the high ion energy.

FIG. 2 is a photograph showing the unevenness of the second photoresist pattern in accordance with a typical method. It is seen that the unevenness of the second photoresist pattern, reference numeral "W" of FIG. 2, occurs.

SUMMARY OF THE INVENTION

Embodiments of the present invention are directed to providing a method for fabricating a semiconductor device, which is capable of improving evenness of critical dimension of patterns, when the patterns are formed by applying a double patterning process.

The embodiments of the present invention are also directed to providing a method for fabricating a semiconductor device, which is capable of preventing transformation of photoresist patterns.

The embodiments of the present invention are also directed to providing a method for double patterning of a semiconductor device, which is capable of obtaining uniform patterns.

In accordance with an aspect of the present invention, there is provided a method for fabricating performing a double pattering process of a semiconductor device is provided. The method includes forming a hard mask layer having a stack structure of a first layer, a second layer and a third layer in sequence, forming a first photoresist pattern over the hard mask layer, etching the third layer to form third layer patterns by using the first photoresist pattern as an etch barrier, forming a second photoresist pattern over the third layer patterns, etching the second layer to form second layer patterns by using the second photoresist pattern and the third layer patterns as an etch barrier, removing the second photoresist pattern, and etching the first layer to form first layer patterns by using the second layer patterns as an etch barrier.

In accordance with an aspect of the present invention, there is provided a method for fabricating a method for fabricating a semiconductor device is provided. The method includes forming an amorphous carbon layer over an etch target layer, forming a hard mask layer having a stack structure of a first layer, a second layer and a third layer in sequence over the amorphous carbon layer, forming a first photoresist pattern over the third layer, etching the third layer to form third layer patterns by using the first photoresist pattern as an etch barrier, forming a second photoresist pattern over the third layer patterns, etching the second layer to form second layer patterns by using the second photoresist pattern and the third layer patterns as an etch barrier, removing the second photoresist pattern, etching the first layer to form first layer patterns by using the second layer patterns as an etch barrier, etching the amorphous carbon layer to form amorphous carbon patterns by using the first layer patterns as an etch barrier, and etching the etch target layer to form patterns by using the amorphous carbon patterns as an etch barrier.

DESCRIPTION OF SPECIFIC EMBODIMENTS

Figure 1A:
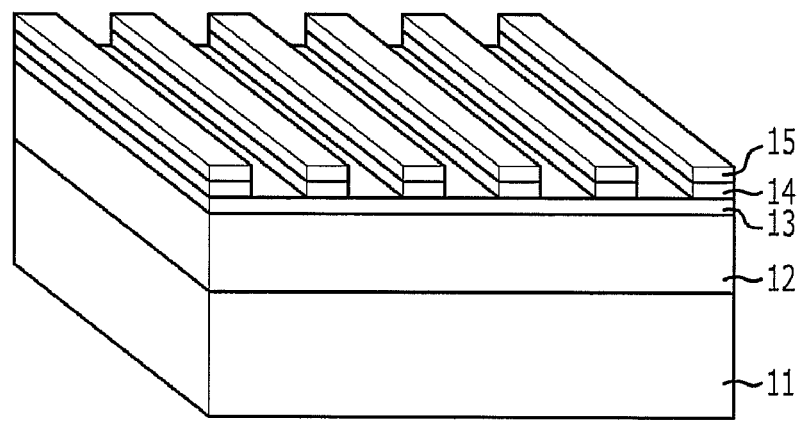
FIGS. 1A to 1D illustrate perspective views of a method for fabricating a semiconductor device using a typical double patterning process.
Figure 1B:
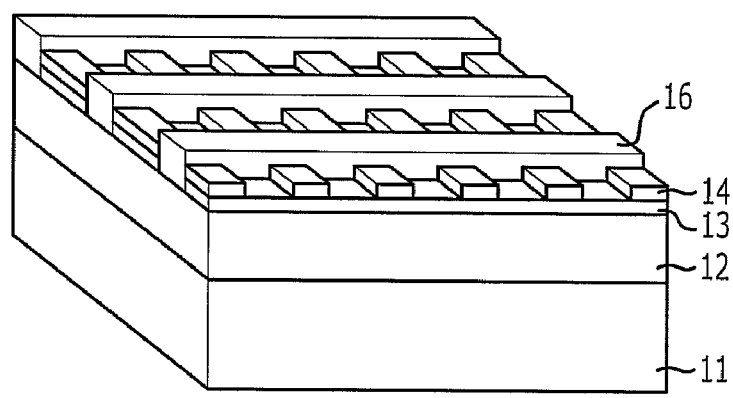
Figure 1C:
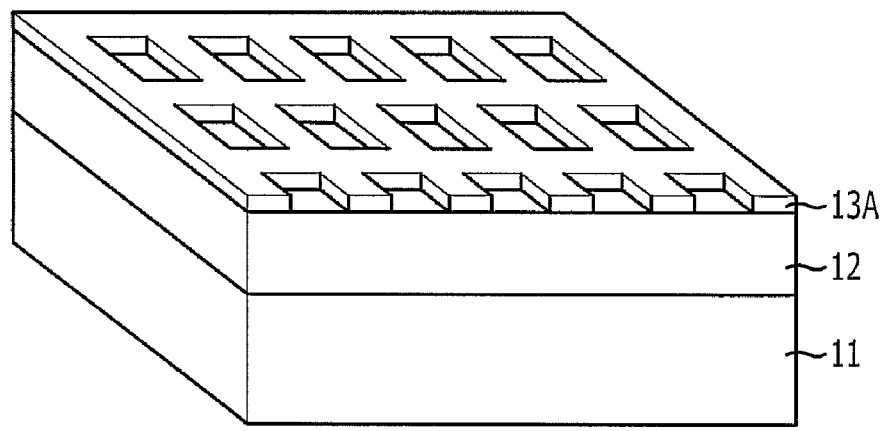
Figure 1D:
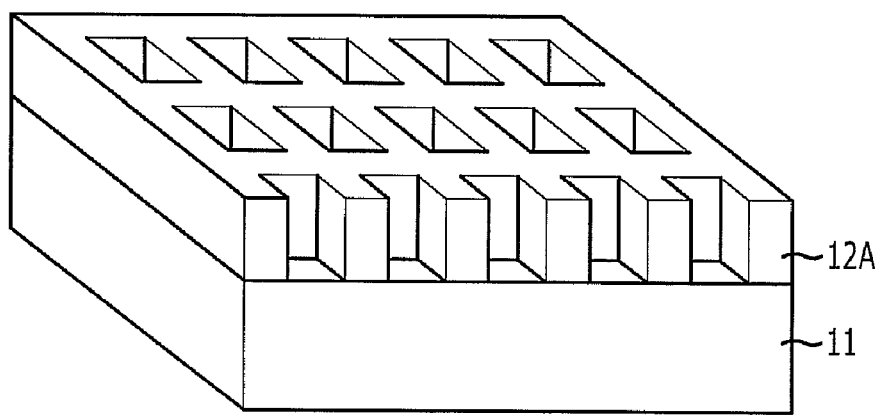
Figure 2:
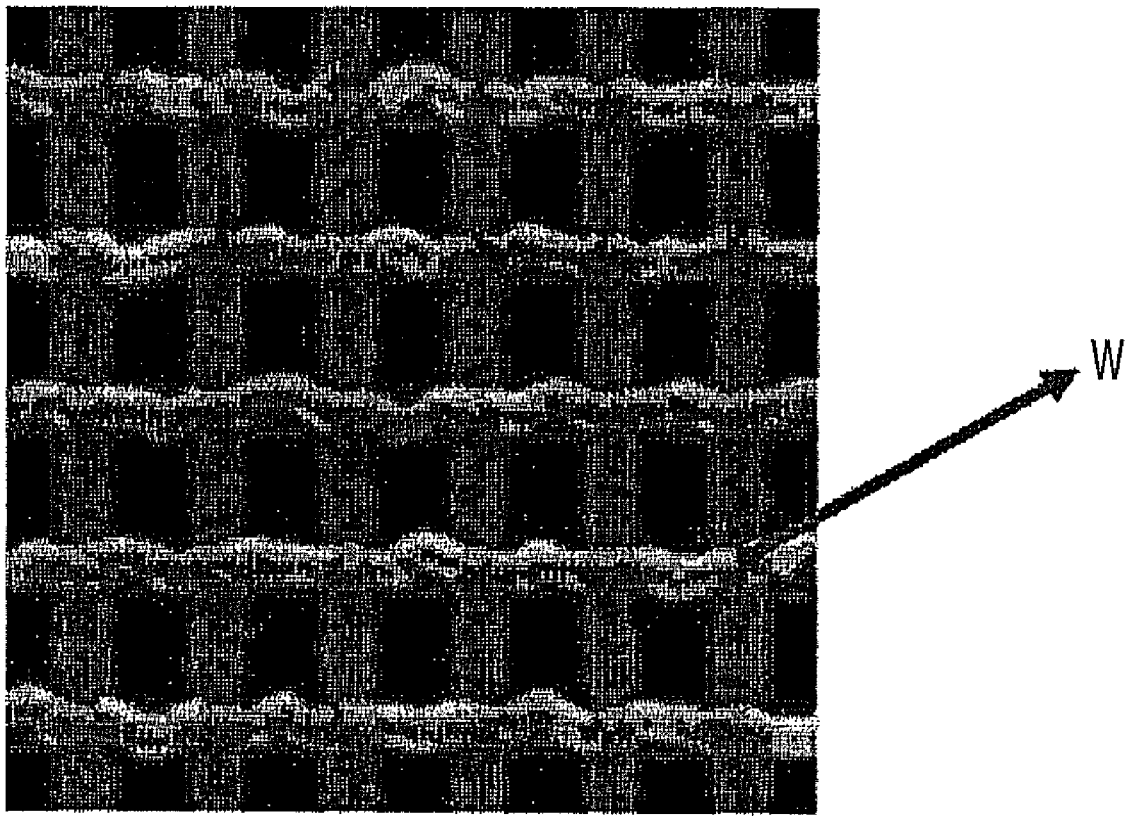
FIG. 2 is a photograph showing unevenness of a second photoresist pattern in accordance with a typical method.

Hereinafter, a method for fabricating a micropattern of a semiconductor device in accordance with the present invention will be described in detail with reference to the accompanying drawings. In the drawings, the thicknesses of layers and regions are exemplary and may not be exact. It will be understood that when an element such as a layer, a film, a pattern and a region is referred to as being "on/under" another element herein, it may be directly on/under the other element, and one or more intervening elements may also be present. Like reference numerals in the drawings denote like elements throughout the drawings. In addition, changes to the reference numerals of layers by, for example, addition of letters, refer to a partial deformation of the layers by an etch process or a polishing process.

Embodiments of the present invention use a triple hard mask as a hard mask instead of using a double hard mask while a double patterning process is performed. The triple hard mask may include compound of materials having different etch selectivity among them.

For example, the triple hard mask may include a hard mask having a stack structure of a first layer, a second layer and a third layer, in sequence, wherein the second layer having an etch selectivity compared to the first layer and the third layer. Herein, the first layer and the third layer have the same etch selectivity and the second layer has a different etch selectivity compared to the first and the third layers. The second layer may have an etch selectivity that is lower or higher than that of the first layer and the third layer.

The triple hard mask may include a triple stack structure of a first oxide layer, a nitride layer and a second oxide layer (Oxide/Nitride/Oxide) in sequence. Thus, the nitride layer is formed between the first oxide layer and the second oxide layer.

Furthermore, the triple hard mask may include a triple stack structure of a first nitride layer, an oxide layer and a second nitride layer (Nitride/Oxide/Nitride) in sequence. Thus, the oxide layer is formed between the first nitride layer and the second nitride layer.

Figure 3A:
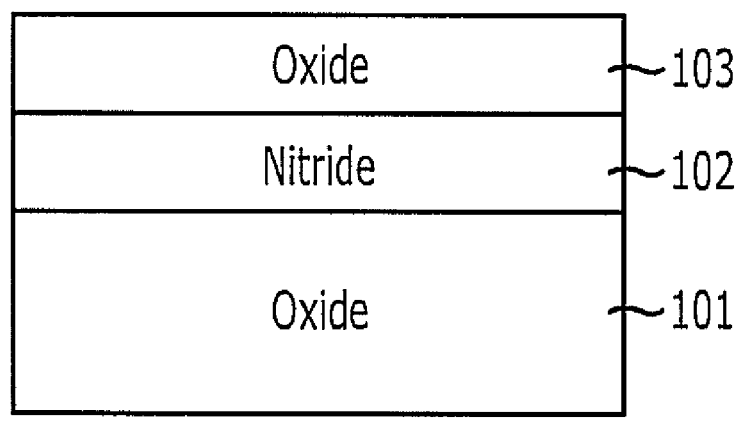
FIGS. 3A and 3B illustrate cross-sectional views of triple hard mask in accordance with embodiments of the present invention.
Figure 3B:
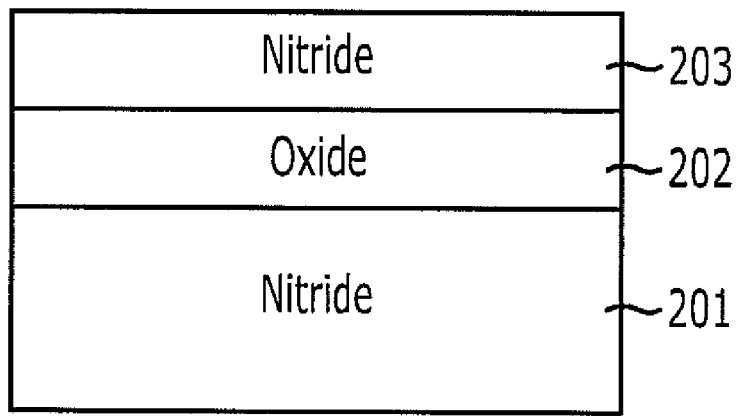

FIGS. 3A and 3B illustrate cross-sectional views of triple hard mask in accordance with embodiments of the present invention.

Referring to FIG. 3A, the triple hard mask is formed by forming a first oxide layer 101, a nitride layer 102 and a second oxide layer 103 in sequence.

Referring to FIG. 3B, the triple hard mask is formed by forming a first nitride layer 201, an oxide layer 202 and a second nitride layer 203 in sequence.

The oxide layers of the triple hard mask including the first oxide layer 101 and the second oxide layer 103 of FIG. 3A and the oxide layer 202 of FIG. 3B may include a silicon oxide ($SiO_2$) layer such as a Tetra Ethyl Ortho Silicate (TEOS) layer. Furthermore, the nitride layers of the triple hard mask including the nitride layer 102 of FIG. 3A, the first nitride layer 201 and the second nitride layer 203 of FIG. 3B may include a silicon oxynitride (SiON) layer, a silicon nitride (SiN) layer or a combination thereof. Thus, the triple hard mask may include one structure of the group consisting of $SiO_2/SiON/SiO_2$, $SiON/SiO_2/SiON$ and $SiO_2/SiN/SiO_2$.

Furthermore, in accordance with another embodiment of the present invention, triple hard mask may include a stack structure having a polysilicon layer between two oxide layers (Oxide/Polysilicon/Oxide), an amorphous carbon layer between two oxide layers (Oxide/A-Carbon/Oxide) or a polysilicon layer between two nitride layers (Nitride/Polysilicon/Nitride). Moreover, the triple hard mask may include a stack structure having a metal layer between two oxide layers (or two nitride layers).

When a triple hard mask is etched, a third layer is etched by using a photoresist pattern having a first line shape as an etch barrier, a second layer is etched by using the photoresist pattern and an etched third layer as an etch barrier, and a first layer is etched by using the etched third layer and an etched second layer as an etch barrier. Herein, when the first layer is etched, the etched second layer is used as an etch barrier since the etch selectivity of the third layer is the same as that of the first layer.

When the third and the second layers are etched, the etching process is performed in a polysilicon etcher having a low ion energy. Prior to etching the first layer, which is the lowest layer of the triple hard mask, the photoresist pattern is removed in advance so as to improve the unevenness.

When the etching of the first layer is performed, the second layer, and no other layer, for example, is used as an etch barrier. Thus, difference of etch characteristics, which may be caused by etch barriers formed of different materials, can be improved.

FIGS. 4A to 4G illustrate perspective views of a method for fabricating a semiconductor device in accordance with an embodiment of the present invention.

Figure 4A:
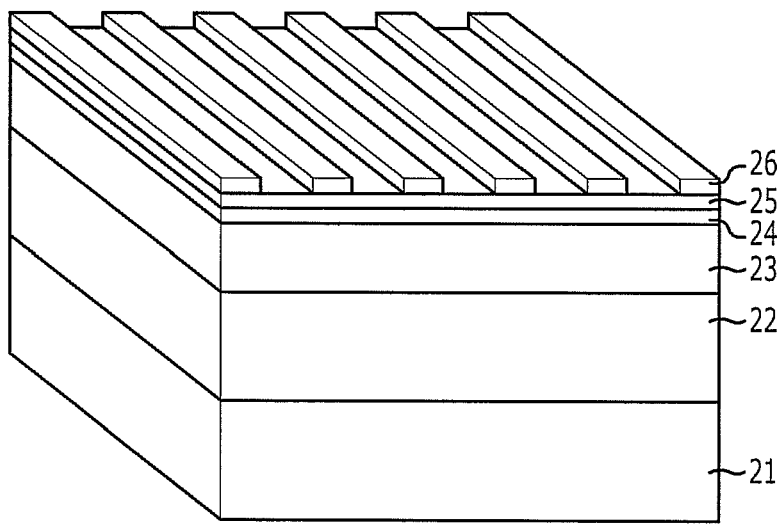
FIGS. 4A to 4G illustrate perspective views of a method for fabricating a semiconductor device in accordance with an embodiment of the present invention.

Referring to FIG. 4A, an etch objective layer is provided. Herein, the etch objective layer may be formed of a stack structure. The stack structure is formed by forming an amorphous carbon layer 22 over an etch target layer 21. The etch target layer 21 is a material which is patterned by etching the etch target layer 21 by using the amorphous carbon layer 22 as an etch barrier. The amorphous carbon layer 22 is a kind of an etch barrier used during the etching of the etch target layer 21. The etch target layer 21 may include a substrate or an insulation layer. It is desirable that the etch target layer 21 may include an oxide layer.

A triple hard mask is formed over the amorphous carbon layer 22.

The triple hard mask includes a first layer 23, a second layer 24 and a third layer 25. The first layer 23 and the third layer 25 have the same etch selectivity, and the second layer 24 has a different etch selectivity compared with the first and the third layers 23 and 25. Furthermore, the second layer 24 is formed between the first layer 23 and the third layer 25. The first layer 23 and the third layer 25 of the triple hard mask may be formed of the same material.

For example, the first layer 23 and the third layer 25 may include an oxide layer and the second layer 24 may include a nitride layer. Furthermore, the first layer 23 and the third layer 25 may include a nitride layer and the second layer 24 may include an oxide layer.

The oxide layer may include a silicon oxide ($SiO_2$) layer such as plasma enhanced tetra ethyl ortho silicate (PETEOS) and the nitride layer may include a silicon nitride (SiN) layer or a silicon oxynitride (SiON) layer.

Furthermore, in accordance with another embodiment of the present invention, triple hard mask may include a stack structure having a polysilicon layer between two oxide layers, an amorphous carbon layer between two oxide layers, a polysilicon layer between two nitride layers or an amorphous carbon layer between two oxide layers. Moreover, the triple hard mask may include a stack structure having a metal layer between two oxide layers or two nitride layers.

As described above, the triple hard mask includes a triple structure formed of different materials having different etch selectivity. Each layer of the triple hard mask may have a thickness ranging between approximately 100 Å and approximately 500 Å.

A first mask patterning process is performed to form a first photoresist pattern 26. The first photoresist pattern 26 is patterned to have a line type. A slant angle of a photolithography process for forming the first photoresist pattern 26 is determined by considering shape of a final pattern of the first photoresist pattern 26. When the final pattern of the first photoresist pattern 26 has a circle shape, the slant angle may be adjusted to approximately 45 degree. Furthermore, when the final pattern of the first photoresist pattern 26 has an oval shape, the slant angle may be adjusted to have a range of approximately 45 degree to approximately 60 degree.

Figure 4B:
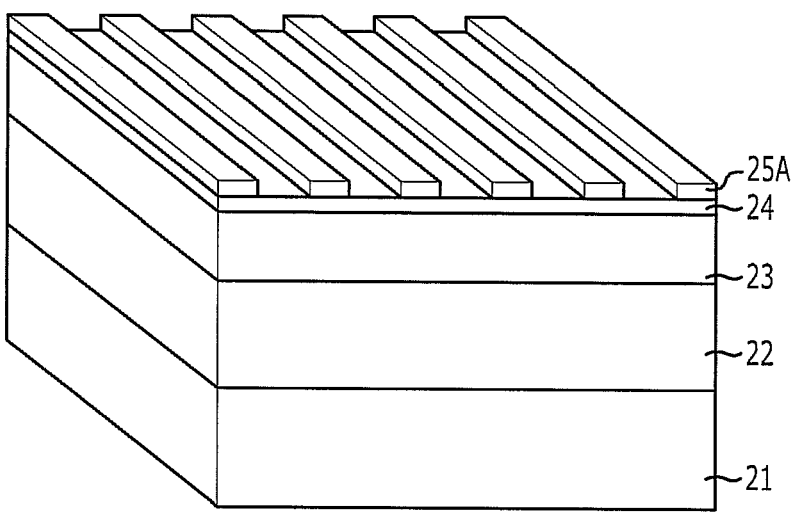

Referring to FIG. 4B, a first hard mask etching process is performed. The first hard mask etching process is performed to etch the third layer 25 by using the first photoresist pattern 26 as an etch barrier. The first hard mask etching process is performed in a polysilicon etcher having a low ion energy in order to prevent unevenness of the first photoresist pattern 26. It is desirable that the first hard mask etching process is performed in transformer coupled plasma (TCP) or inductively coupled plasma (ICP), which has a low ion energy, in order to prevent unevenness of the first photoresist pattern 26. Moreover, the first hard mask etching process is performed at a low bias power range. The low bias power has a range of approximately 1 W to approximately 500 W.

Then, the first photoresist pattern 26 is removed.

As a matter of convenience of explanation, the first layer 23 and the third layer 25 of the triple hard mask are oxide layers and the second layer 24 is a nitride layer.

Since the third layer 25 is the oxide layer, the third layer 25 may be etched by using a fluorocarbon based gas having a low ratio of carbon compared with fluorine such as $C_4F_8$. The third layer 25 may also be etched by using the fluorocarbon based gas adding an oxide ($O_2$) gas. Therefore, damage of the second layer 24 under the third layer 25 can be minimized. Herein the second layer 24 is the nitride layer.

Third layer patterns 25A are formed by the first hard mask etch process and the third layer patterns 25A have a line pattern by copying the shape of the first photoresist pattern 26.

Figure 4C:
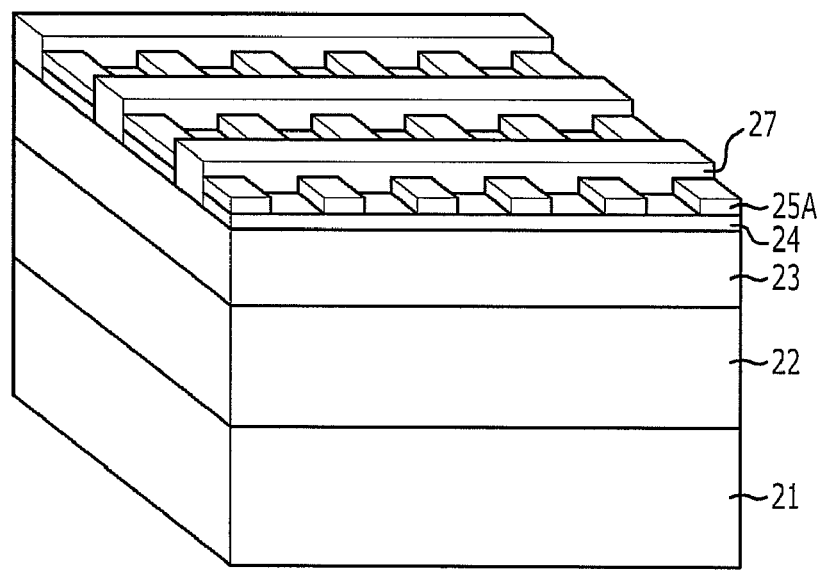

Referring to FIG. 4C, a second mask patterning process is performed to form a second photoresist pattern 27. The second photoresist pattern 27 is patterned to have a line type. Furthermore, a photolithography process for forming the second photoresist pattern 27 is performed with a slant angle which is symmetrical with the slant angle of the photolithography process for forming the first photoresist pattern 26 of FIG. 3A.

When the slant angle for forming the first photoresist pattern 26 is approximately 45 degree, the slant angle for forming the second photoresist pattern 27 is approximately −45 degree. A final hole with a circle shape is patterned. In other cases, the final hole with an oval shape is patterned.

Figure 4D:
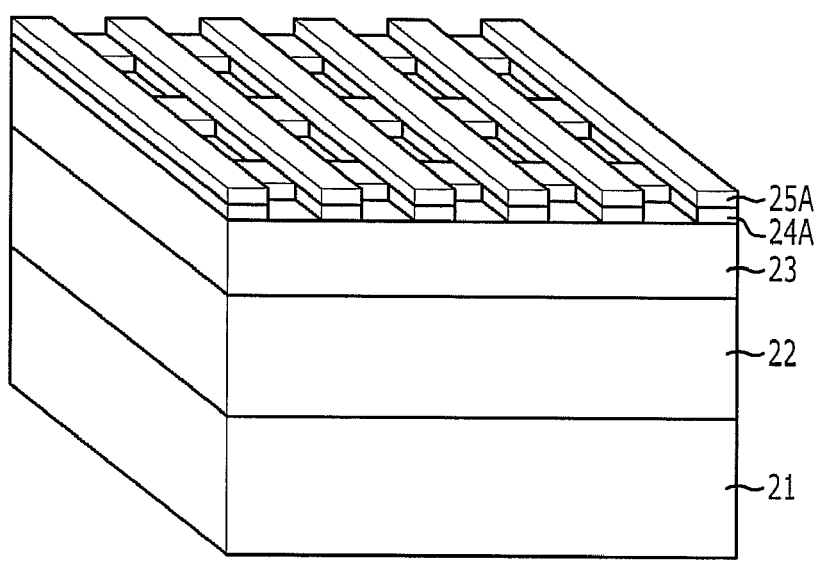

Referring to FIG. 4D, a second hard mask etching process is performed. The second hard mask etching process is performed to etch the second layer 24 by using the second photoresist pattern 27 as an etch barrier. The second hard mask etching process is performed by using the second photoresist pattern 27 as the etch barrier in one direction and using the third layer patterns 25A as an etch barrier in other direction. The second hard mask etching process is performed in a polysilicon etcher having a low ion energy in order to prevent unevenness of the second photoresist pattern 27. It is desirable that the second hard mask etching process is performed in TCP or ICP, which has a low ion energy, in order to prevent unevenness of the second photoresist pattern 27. Moreover, the second hard mask etching process is performed at a low bias power range. The low bias power has a range of approximately 1 W to approximately 500 W. In order to have an etch selectivity of the third layer patterns 25A, which is an oxide layer, compared with the second layer 24, which is a nitride layer, a plasma is used. The plasma may include one selected from a group comprising difluoromethane ($CH_2F_2$), trifluoromethane ($CHF_3$) and sulfur hexafluoride ($SF_6$).

After removing the second photoresist pattern 27, remaining polymer is removed by using a wet cleaning process. Possibility of causing unevenness can be prevented during an etching of the first layer 23 after removing the second photoresist pattern 27.

A second hard mask etching process is performed to form second layer patterns 24A. Furthermore, the second layer patterns 24A is formed by using the second photoresist pattern 27 and the third layer patterns 25A as an etch barrier. Thus, a hole shape pattern is defined since the second photoresist pattern 27 crosses the third layer patterns 25A.

Figure 4E:
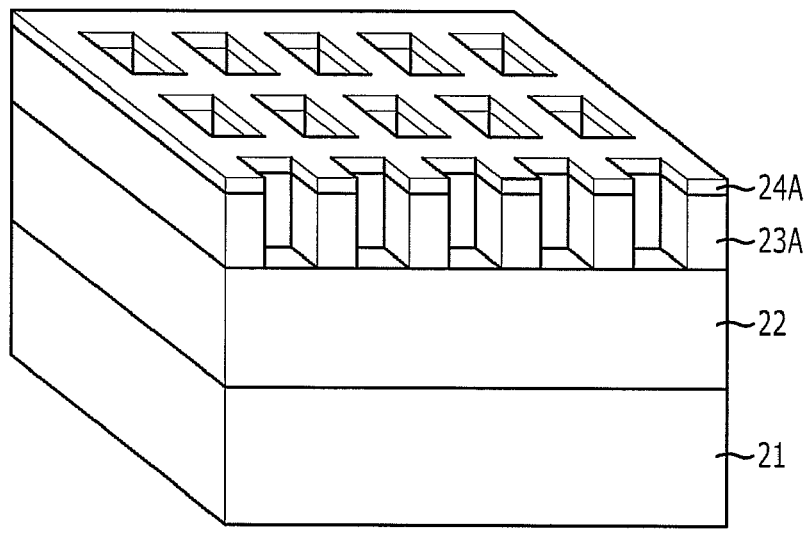

Referring to FIG. 4E, a third hard mask etching process is performed to etch the first layer 23.

The third hard mask etching process is performed by using the second layer pattern 24A as an etch barrier. A self-aligned contact gas, which generates much polymer, may be used since the first layer 23 and the third layer patterns 25A are the oxide layers and the second layer patterns 24A are the nitride layer. The self-aligned contact gas may include carbon-fluorine-based (CF-based) gas such as hexafluorobutadiene ($C_4F_6$) and octafluorocyclobutane ($C_4F_8$). Furthermore, unevenness can be prevented/reduced regardless an ion energy of an etch apparatus, since photoresist pattern is removed.

Since the first layer 23 is etched by using the second layer patterns 24A as an etch barrier, etch characteristics between the first layer 23 and the second layer patterns 24A are not different. Herein, although the third layer patterns 25A still remain on the second layer patterns 24A, etch characteristics between the first layer 23 and the third layer patterns 25A are not different since the first layer 23 and the third layer patterns 25A are formed of the same material. That is, when the first layer 23 is etched, the third layer patterns 25A are also etched. Therefore, the third layer patterns 25A do not remain. Thus, the second layer patterns 24A are used as an etch barrier.

In another embodiment, when the first layer 23 and the third layer 25 are nitride layers, and the second layer 24 is an oxide layer, etching of the third layer 25 to the first layer 23, a first hard mask etching process to a third hard mask etching process are performed as described hereafter.

The first hard mask etching process is performed to etch the third layer by using a gas mixture including tetrafluoromethane ($CF_4$) and fluoroform ($CHF_3$). During a second hard mask etching process to etch the second layer 24, the second layer 24 may be etched by using a fluorocarbon based gas having a low ratio of carbon compared with fluorine such as $C_4F_8$. The second layer 24 may also be etched by using the fluorocarbon based gas adding an oxide ($O_2$) gas. The third hard mask etching process to etch the first layer 23 is performed by using a gas having an etch selectivity to the first layer 23. The gas may include one selected from a group consisting of $CH_2F_2$, $CHF_3$ and $SF_6$. Herein, unevenness can be prevented/reduced since the third hard mask etching process is performed without any photoresist layer or pattern. Furthermore, etch characteristics between the first layer 23 and the second layer 24 are not different.

As described above, the series of processes, which include forming of the first photoresist pattern, performing the first hard mask etching process, forming of the second photoresist pattern, performing the second hard mask etching process and performing the third hard mask etching process in sequence, is called as a double patterning process.

Figure 4F:
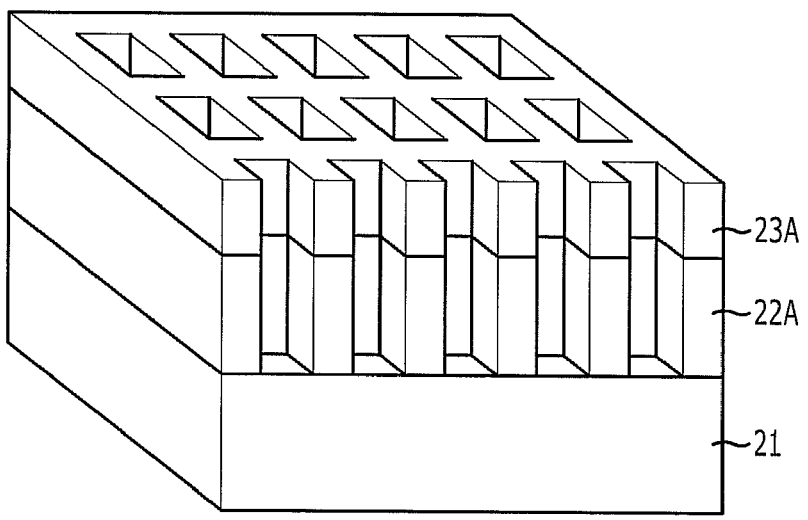

Referring to FIG. 4F, the amorphous carbon layer 22 is etched by using the first layer patterns 23A as an etch barrier. Thus, amorphous carbon patterns 22A are formed. Herein, the amorphous carbon layer patterns 22A have a plurality of openings by copying a shape of the first layer patterns 23A.

Figure 4G:
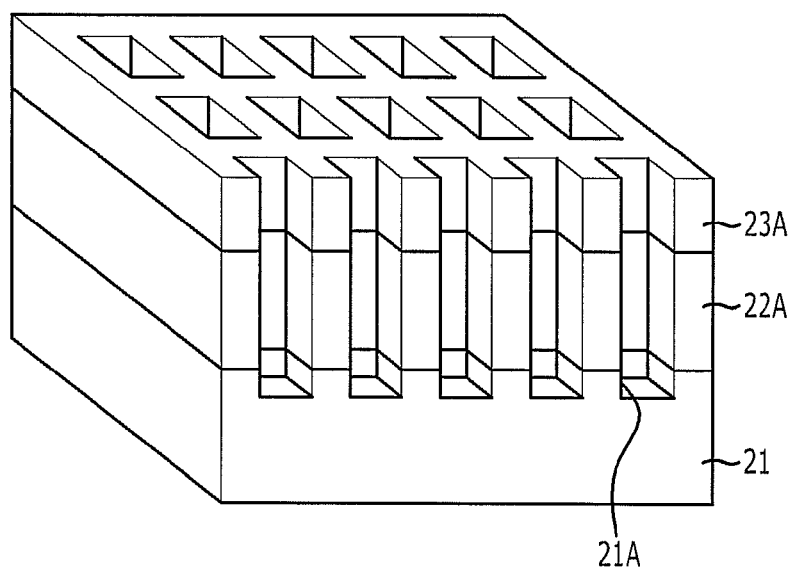

Referring to FIG. 4G, the etch target layer 21 is etched by using the amorphous carbon patterns 22A as an etch barrier. Thus, patterns 21A are formed. The patterns 21A include contact holes such as a storage node hole. Herein, the storage node hole represents a region where a cylinder type storage node for a capacitor is going to be formed. Therefore, according to the embodiment of the present invention, a hole patterning is made possible by using the double patterning process. Thus, a capacitor having a line width of 40 nm or less can be formed.

Figure 5:
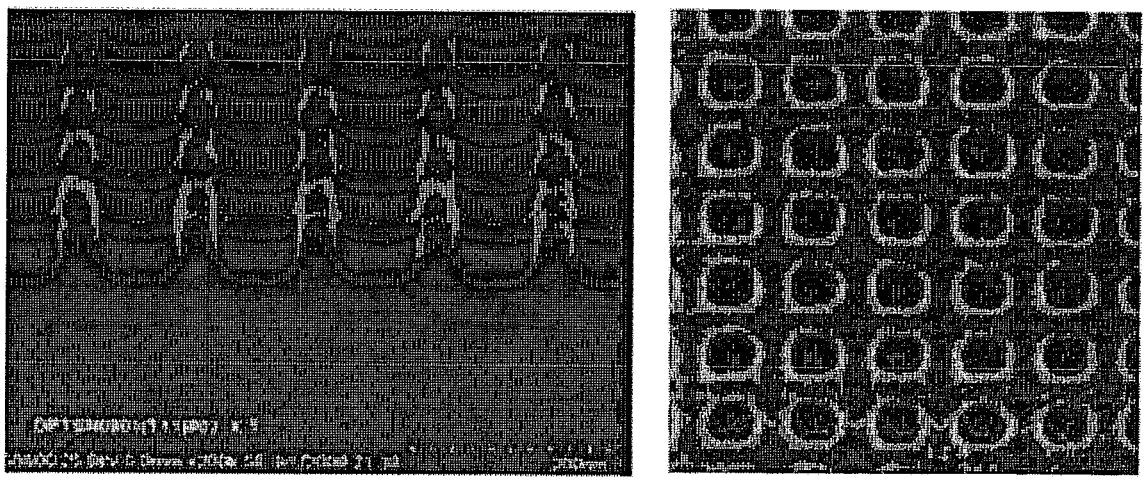
FIG. 5 is micrographic views of results of formation of first layer pattern in accordance with an embodiment of the present invention.

FIG. 5 is micrographic views of results of formation of first layer pattern in accordance with an embodiment of the present invention. It is recognizable that unevenness is not occurred.

The present invention as described above, while performing the double patterning process, a triple hard mask is used. Herein, the triple hard mask may include a hard mask having a stack structure of a first layer, a second layer and a third layer, in sequence. When the third layer and the second layer are etched, the etching process is performed in a polysilicon etcher having a low ion energy. Furthermore, prior to etching the first layer, which is the lowest layer of the triple hard mask, the photoresist pattern is removed in advance so as to improve the unevenness.

Moreover, difference in etch characteristics, which may occur by using different etch barriers, can be improved, since the second layer is used as an etch barrier while the first layer is etched.

As a result, in accordance with the present invention, a hole patterning with a fine line width can be achieved, as a double patterning process is performed by using a triple hard mask layers having different etch selectivity among them. Thus, high integrated semiconductor devices having a line width of 40 nm or less can be fabricated.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for performing a double patterning process of a semiconductor device, the method comprising:
    forming a hard mask layer having a stack structure of a first layer, a second layer formed over the first layer, and a third layer formed over the second layer in sequence;
    forming a first photoresist pattern over the hard mask layer;
    etching the third layer to form third layer patterns by using the first photoresist pattern as an etch barrier;
    forming a second photoresist pattern over the third layer patterns, wherein the first photoresist pattern and the second photoresist pattern form lines that orthogonally cross each other;
    etching the second layer to form second layer patterns by using the second photoresist pattern and the third layer patterns as an etch barrier;
    removing the second photoresist pattern; and
    etching the first layer to form first layer patterns by using only the second layer patterns as an etch barrier so that the first layer patterns have hole patterns,
    wherein the first layer and third layer are formed of the same material and the second layer is formed of a material having an etch selectivity with respect to the first and third layers.

2. The method of claim 1 wherein the forming of the second photoresist pattern is performed by a photolithography process with a slant angle symmetrical with a slant angle of a photolithography process for forming the first photoresist pattern.

3. The method of claim 1, wherein the second layer is formed of a material having an etch selectivity which is greater than or lower than that of the first and third layers.

4. The method of claim 1, wherein the first and third layers include an oxide layer and the second layer includes a nitride layer.

5. The method of claim 1, wherein the first and third layers include a nitride layer and the second layer includes an oxide layer, a polysilicon layer or an amorphous carbon layer.

6. The method of claim 4, wherein the oxide layer includes a silicon oxide layer and the nitride layer includes a silicon nitride (SiN) layer or a silicon oxynitride (SiON) layer.

7. The method of claim 6, wherein the silicon oxide layer includes a plasma enhanced tetra ethyl ortho silicate (PE-TEOS) layer.

8. The method of claim 1, wherein the first and third layers include an oxide layer and the second layer includes a polysilicon layer or an amorphous carbon layer.

9. The method of claim 1, wherein the etching of the third and second layers is performed by using a power ranging between approximately 1 W and approximately 500 W.

10. The method of claim 1, wherein the etching of the third and second layers is performed by using a transformer coupled plasma (TCP) type plasma source or inductively coupled plasma (ICP) type plasma source.

11. A method for fabricating a semiconductor device, the method comprising:
forming an amorphous carbon layer over an etch target layer;
forming a hard mask layer having a stack structure of a first layer, a second layer formed over the first layer, and a third layer formed over the second layer in sequence over the amorphous carbon layer;
forming a first photoresist pattern over the third layer;
etching the third layer to form third layer patterns by using the first photoresist pattern as an etch barrier;
forming a second photoresist pattern over the third layer patterns, wherein the first photoresist pattern and the second photoresist pattern form lines that orthogonally cross each other;
etching the second layer to form second layer patterns by using the second photoresist pattern and the third layer patterns as an etch barrier;
removing the second photoresist pattern;
etching the first layer to form first layer patterns by using only the second layer patterns as an etch barrier so that the first layer patterns have hole patterns;
etching the amorphous carbon layer to form amorphous carbon patterns by using the first layer patterns as an etch barrier; and
etching the etch target layer to form patterns by using the amorphous carbon patterns as an etch barrier,
wherein the first layer and the third layer are formed of the same material and the second layer is formed of a material having an etch selectivity with respect to the first and third layers.

12. The method of claim 11, after removing the second photoresist pattern, further comprising, performing a wet cleaning process.

13. The method of claim 11, wherein the forming of the second photoresist pattern is performed by a photolithography process with a slant angle symmetrical with a slant angle of a photolithography process for forming the first photoresist pattern.

14. The method of claim 11, wherein the second layer is formed of a material having an etch selectivity which is greater than or lower than that of the first and third layers.

15. The method of claim 11, wherein the first and third layers include an oxide layer and the second layer includes a nitride layer.

16. The method of claim 11, wherein the first and third layers include a nitride layer and the second layer includes an oxide layer, a polysilicon layer or an amorphous carbon layer.

17. The method of claim 15, wherein the oxide layer includes a silicon oxide layer and the nitride layer includes a silicon nitride (SiN) layer or a silicon oxynitride (SiON) layer.

18. The method of claim 17, wherein the silicon oxide layer includes a PETEOS layer.

19. The method of claim 11, wherein the first and third layers include an oxide layer and the second layer includes a polysilicon layer or an amorphous carbon layer.

20. The method of claim 11, wherein the etching of the third and second layers is performed by using a low bias power ranging between approximately 1 W and approximately 500 W.

21. The method of claim 11, wherein the etching of the third and second layers is performed by using a TCP type plasma source or ICP type plasma source.

22. The method of claim 16, wherein the etching of the third layer is performed by using a tetrafluoromethane ($CF_4$) gas as a main etch gas and additionally adding a fluoroform ($CHF_3$) gas, the etching of the second layer is performed by using a hexafluorobutadiene ($C_4F_6$) gas or an octafluorocyclobutane ($C_4F_8$) gas as a main etch gas and additionally adding an oxide ($O_2$) gas, and the etching of the first layer is performed by using one selected form a group consisting of a difluoromethane ($CH_2F_2$) gas, $CHF_3$ gas and sulfur hexafluoride ($SF_6$) gas.

23. The method of claim 15, wherein the etching of the third layer is performed by using a $CF_4$ gas or using a gas mixture of a $C_4F_8$ gas and $O_2$ gas, the etching of the second layer is performed by using one selected from a group consisting of a $CH_2F_2$ gas, a $CHF_3$ gas and a $SF_6$ gas, and the etching of the first layer is performed by using a $C_4F_6$ gas or $C_4F_8$ gas.

24. The method of claim 11, wherein the patterns formed by etching the etch target layer include contact holes.

* * * * *